United States Patent [19]

Suzuki et al.

[11] Patent Number: 5,319,220
[45] Date of Patent: Jun. 7, 1994

[54] SILICON CARBIDE SEMICONDUCTOR DEVICE

[75] Inventors: Akira Suzuki, Nara; Katsuki Furukawa, Sakai; Mitsuhiro Shigeta, Joyo; Yoshihisa Fujii, Nagoya; Atsuko Ogura, Nara, all of Japan

[73] Assignee: Sharp Kabushiki Kaisha, Osaka, Japan

[21] Appl. No.: 895,452

[22] Filed: Jun. 8, 1992

Related U.S. Application Data

[63] Continuation of Ser. No. 541,212, Jun. 22, 1990, abandoned, which is a continuation of Ser. No. 299,019, Jan. 19, 1989, abandoned.

[30] Foreign Application Priority Data

Jan. 20, 1988 [JP] Japan .................. 63-11639

[51] Int. Cl.$^5$ .................. H01L 29/161; H01L 21/20
[52] U.S. Cl. .................. 257/77; 257/94; 257/103; 257/197; 257/565; 437/100
[58] Field of Search .................. 357/61, 16, 34, 17, 357/30; 437/100; 148/DIG. 148; 257/77, 94, 103, 183, 197, 461, 565

[56] References Cited

U.S. PATENT DOCUMENTS

| | | | |
|---|---|---|---|
| 3,504,181 | 3/1970 | Chang et al. | 148/148 |
| 4,531,142 | 7/1985 | Weyrich et al. | 357/17 |
| 4,623,425 | 11/1986 | Suzuki et al. | 156/613 |
| 4,757,028 | 7/1988 | Kondoh et al. | 437/100 |

FOREIGN PATENT DOCUMENTS

60-145992 8/1985 Japan .

OTHER PUBLICATIONS

Journal of Applied Physics vol. 61 #3 pp. 1134–1136 by Okumura et al. 357/61 Feb. 1, 1987.
Solid State Electronics vol. 21 pp. 479–480 by v. Munch et al. 437/100 1978.
Akira Susuki et al., Liquid-Phase Epitaxial Growth of 6H-SiC By The Dipping Technique for Preparation of Blue-Light-Emitting Diodes, May 13, 1976, pp. 4546–4547.
Robert B. Campbell and Hung-Chi Chang, *Semiconductor and Semimetals*, vol. 7 1971, pp. 625–683.
"Epitaxial Growth of SiC Single Crystals By Successive Two-Step CVD", Journal of Crystal Grown, vol. 70 (1984) pp. 287–290 by Suzuki et al.
"Production of Large-Area Single-Crystal Wafers of Cubic SiC for Semiconductor Devices", pp. 460–462, Applied Physics Letters vol. 42 #5, Mar. 1, 1983 by Nishino et al.

*Primary Examiner*—Mark V. Prenty

[57] ABSTRACT

A silicon carbide semiconductor device is provided which includes at least one heterojunction composed of two different polytypes of silicon carbide. The two polytypes of silicon carbide in the heterojunction include a β-type silicon carbide layer having an α-type silicon carbide layer disposed thereon.

2 Claims, 3 Drawing Sheets

SILICON CARBIDE SEMICONDUCTOR DEVICE

This application is a continuation of application Ser. No. 07/541,212 filed on Jun. 22, 1990, now abandoned; which is a continuation of Ser. No. 07/299,019 filed on Jan. 19, 1989, now abandoned.

BACKGROUND OF THE INVENTION

1. Field of the Invention

This invention relates to a silicon carbide semiconductor device having at least one heterojunction.

2. Description of the Prior Art

Silicon carbide (SiC) is a semiconductor material, which has a wide forbidden band gap between 2.2 and to 3.3 electronvolts (eV) as compared with conventional semiconductor materials, such as silicon and gallium arsenide, which have extensively come into use. A silicon carbide semiconductor is thermally, chemically and mechanically stable and also has a great resistance to radiation damage. Both p-type and n-type silicon carbides have good stability, which is rare for wide-gap semiconductors, making these semiconductors useful as semiconductor materials for optoelectronic devices utilizing visible light of short wavelengths, for electronic devices operable at high temperatures or at great electric power, for highly reliable semiconductor devices, for radiation-resistant devices, etc. These semiconductors may be used in an environment where difficulties are encountered with devices made of conventional semiconductor materials, and the range of applications for semiconductor devices using these materials is greatly enlarged.

Silicon carbide has many variant crystal structures (i.e., polytypes or polymorphic forms), which are classified into two types, $\alpha$- and $\beta$-silicon carbides. $\alpha$-silicon carbide of a hexagonal or rhombohedral crystal structure has a forbidden band gap as wide as 2.9 to 3.3 eV, while $\beta$-silicon carbide of a cubic crystal structure has a forbidden band gap as narrow as 2.2 eV. Despite many advantages and capabilities, silicon carbide (including $\alpha$- and $\beta$-silicon carbides) has not yet been placed in actual use because the technique for growing single crystals of silicon carbide with good reproducibility, which is required for commercially producing high-quality silicon carbide wafers having a large surface area has not yet been developed.

In recent years, the inventors have developed a process for growing large-sized high-quality single crystals of $\beta$-silicon carbide on a single-crystal substrate of silicon by the chemical vapor deposition (CVD) technique and filed a Japanese Patent Application No. 58-76842 (76842/1983) which corresponds to U.S. Pat. No. 4,623,425. This process (referred to as a successive two step CVD technique) includes the steps of growing a thin film of silicon carbide on a silicon substrate by the CVD method at a low temperature and then growing a single-crystal film of silicon carbide on the said thin film by the CVD method at a higher temperature. Results for the application of this process have also been reported in the Journal of Crystal Growth, 70, 1984.

Also, another process for growing large-sized single crystals of $\beta$-silicon carbide by the carbonization CVD technique is disclosed in Applied Physics Letters, 42(5), 1 Mar. 1983. Moreover, the inventors have devised a process for growing single crystals of $\alpha$-silicon carbide and filed a Japanese Patent Application No. 58-246512 (246512/1983) which corresponds to U.S. patent application Ser. No. 683,651 filed Dec. 19, 1984 and now U.S. Pat. No. 5,037,502. At the present time, these techniques make it possible to produce large-sized high-quality single crystals of $\alpha$- and $\beta$-silicon carbide, while controlling the polytype, the concentration of impurities, the size, the shape or similar characteristics or single crystals.

On the other hand, in the present semiconductor industry, various semiconductor devices such as diodes, transistors, integrated circuits, large-scale integrated circuits, light-emitting diodes, semiconductor lasers, solar cells, and charge coupled devices, which are made of silicon or a compound semiconductor material such as gallium arsenide or gallium phosphide, have extensively come into use. Many of these semiconductor devices have at least one heterojunction composed of semiconductors with different forbidden band gaps, so that the efficiency of injection of carriers such as electrons or holes, the luminous efficiency of light-emitting devices, and the photoelectric efficiency of photodetectors can be improved so that excellent operating characteristics can be attained.

For silicon carbide semiconductor devices, it is possible to improve the operating characteristics of transistors, the luminous efficiency of light-emitting devices, and the photoelectric efficiency of photodetectors by utilizing the heterojunction composed of silicon carbide and a semiconductor with a forbidden band gap different from the band gap of the silicon carbide. It is also possible to develop a semiconductor device which can accomplish novel functions. However, in general, if semiconductor materials other than silicon carbide are used as the above-mentioned semiconductor with a different forbidden band gap, crystal defects will occur at the heterojunction due to the difference between the sizes of their crystal lattices (i.e., lattice mismatches). Moreover, because the heterojunction is composed of silicon carbide and another semiconductor material, the region near the heterojunction is contaminated by a small amount of impurities, so that a deterioration of the device characteristics is caused.

SUMMARY OF THE INVENTION

The silicon carbide semiconductor device of this invention, which overcomes the above-discussed and numerous other disadvantages and deficiencies of the prior art, includes at least one heterojunction composed of two different polytypes of silicon carbide.

In a preferred embodiment, the polytypes of silicon carbide are of $\alpha$- and $\beta$-type silicon carbides.

In a preferred embodiment, the semiconductor device is selected from a group of devices consisting of diodes, transistors, light-emitting diodes, laser diodes, charge coupled devices, and integrated circuits thereof.

In a preferred embodiment, the semiconductor device is a light-emitting diode including a substrate of a first conductivity type made of a first polytype of silicon carbide, a semiconductor layer of a second conductivity type made of a first polytype of silicon carbide, and a semiconductor layer of a second conductivity type made of a second polytype of silicon carbide.

In a preferred embodiment, the semiconductor device is a photodiode including a substrate of a first conductivity type made of a first polytype of silicon carbide and a semiconductor layer of a second conductivity type made of a second polytype of silicon carbide.

In a preferred embodiment, the semiconductor device is a bipolar transistor including a collector of a first conductivity type made of a first polytype of silicon carbide, a base of a second conductivity type made of a first polytype of silicon carbide, and an emitter of a first conductivity type made of a second polytype of silicon carbide.

Thus, the embodiments of the present invention described above makes possible the objectives of: (1) providing a silicon carbide semiconductor device with at least one heterojunction in which the heterojunction is composed of two different polytypes of silicon carbide, so that crystal defects due to lattice mismatch, contamination by impurities, etc., will not occur at the heterojunction, and excellent operating characteristics are attained; and (2) providing a silicon carbide semiconductor device which can accomplish novel functions based on the heterojunctions.

BRIEF DESCRIPTION OF THE DRAWINGS

The embodiment of this invention may be better understood and its numerous objects and advantages will become apparent to those skilled in the art by reference to the accompanying drawings as follows.

DESCRIPTION OF THE PREFERRED EMBODIMENT

As mentioned above, there are many polytypes of silicon carbide. These silicon carbides have different crystal structures and different forbidden band gaps, respectively, and there is no difference in bond length between the adjacent atoms which determine the size of the crystal lattices. In the silicon carbide semiconductor device of this invention, two different polytypes of silicon carbide are used as semiconductor materials which constitute a heterojunction for attaining excellent operating characteristics. The heterojunctions contained in the semiconductor device of this embodiment are preferably composed of $\alpha$- and $\beta$-silicon carbides. Because there is no lattice mismatch at a heterojunction composed of two different polytypes of silicon carbide, it is possible to prevent crystal defects from occurring at the heterojunction. Moreover, because such a heterojunction is composed of semiconductors with the same composition, it is possible to prevent contamination by impurities at the heterojunction.

The embodiments of this invention will be further illustrated by reference to the following examples. Examples of silicon carbide semiconductors of this invention are a light-emitting diode, a photodiode, and a bipolar transistor. In these examples, the crystal growth of $\alpha$- and $\beta$-silicon carbides is carried out by using the CVD method which has been devised by the inventors. For the CVD method, monosilane ($SiH_4$) is used as a silicon source, propane ($C_3H_8$) as a carbon source, and hydrogen ($H_2$) as a carrier gas. According to this crystal growth method, a single-crystal film of silicon carbide having a thickness between 1 and 2 $\mu$m can be obtained in 1 hour.

EXAMPLE 1

Figure 1:
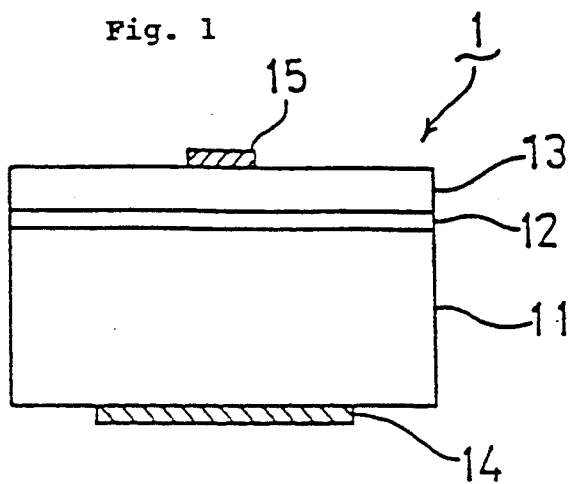
FIG. 1 is a sectional view showing a silicon carbide semiconductor device, i.e., a light-emitting diode, for one embodiment of this invention.

FIG. 1 shows a silicon carbide semiconductor device, i.e., a light-emitting diode 1, for one embodiment of this invention, which is produced as follows: On an n-type $\beta$-SiC substrate 11 (the thickness thereof being about 30 $\mu$m) which has been produced by the CVD method, a p-type $\beta$-SiC layer 12 (the thickness thereof being about 0.5 $\mu$m) is formed by the CVD method. For doping of impurities, phosphorus (P), nitrogen (N), etc., can be used as an n-type impurity, and boron (B), aluminum (Al), etc., can be used as a p-type impurity. Usually, the impurity is fed in the form of gaseous compounds to a reactor tube and incorporated into the single-crystal film of silicon carbide. For example, phosphine ($PH_3$) is used as a phosphorus source, nitrogen ($N_2$) or ammonia ($NH_3$) as a nitrogen source, diboran ($B_2H_6$) as a boron source, and aluminum trichloride ($AlCl_3$) or organic aluminum compounds as an aluminum source.

Then, on the p-type $\beta$SiC layer 12, a p-type $\alpha$-SiC layer 13 (the thickness thereof being about 1 $\mu$m) is grown with the same p-type impurity that is used for the p-type $\beta$-SiC layer 12. Then, the back face of the n-type $\beta$-SiC substrate 11 and the upper face of the p-type $\alpha$-SiC layer 13 are subjected to a vapor deposition treatment with nickel (Ni) and an alloy of aluminum-silicon (Al-Si), respectively, resulting in an n-sided ohmic electrode 14 and a p-sided ohmic electrode 15, respectively. Finally, a leading wire is connected to each of the electrodes 14 and 15 so that the light emitting diode 1 will result.

The light-emitting diode 1 has a structure in which the p-type $\alpha$-SiC layer 13 with a wide forbidden band gap is disposed on the p-n junction light-emitting diode consisting of the p-type $\beta$-SiC layer 12 and the n-type $\beta$-SiC substrate 11. The p-type $\beta$SiC layer 12 and the p-type $\alpha$-SiC layer 13 constitute a heterojunction.

Figure 2:
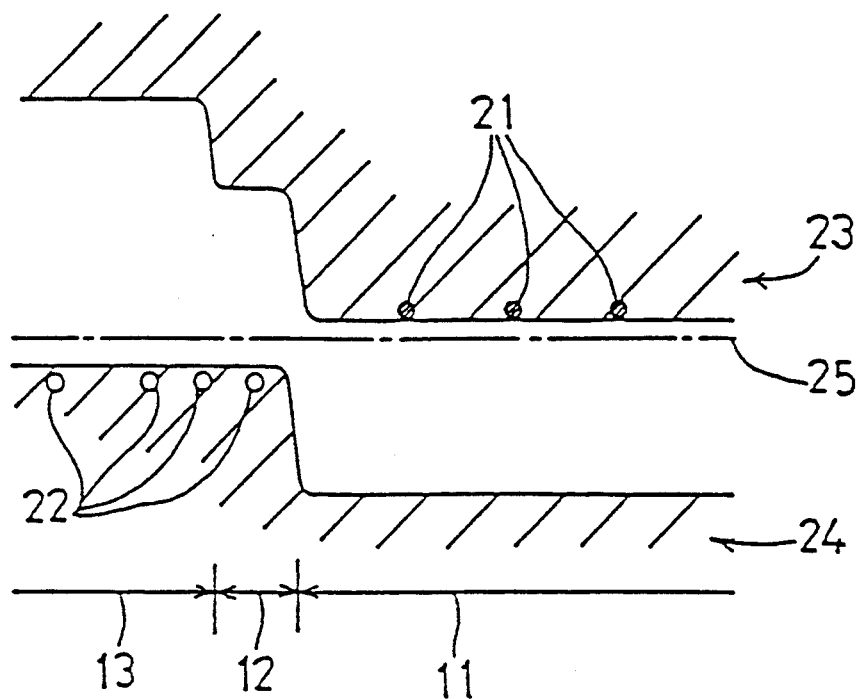
FIG. 2 is a schematic diagram showing a structure for the energy bands of the silicon carbide semiconductor device shown in FIG. 1.

The operation of the light-emitting diode 1 will be explained hereinafter. FIG. 2 shows a structure of the energy bands of the light-emitting diode 1. In this figure, the conduction band, the valence band, and the Fermi level are represented by reference numeral 23, 24, and 25, respectively. If a forward bias voltage is applied to the light-emitting diode 1, electrons 21 present in the conduction band 23 of the n-type $\beta$-SiC substrate 11 will be injected into the p-type $\beta$-SiC layer 12. The injected electrons 21 end their lives by recombining with holes 22 present in the valence band 24 of the p-type $\beta$-SiC layer 12, so that the emission of light results. A potential barrier to the electrons 21 exists at the heterojunction composed of the p-type $\beta$-SiC layer 12 and the p-type $\alpha$-SiC layer 13, so that the electrons 21 injected from the n-type $\beta$-SiC substrate 11 are confined in the narrow p-type $\beta$-SiC layer 12, so that the effective recombination with the holes 22. 22 is attained. This process contributes to the emission of light. Moreover, the p-type $\alpha$-SiC layer 13 formed on the p-type $\beta$-SiC layer 12 prevents the recombination from occurring on the surface of the p-type $\beta$-SiC 12. The forbidden band gap of the p-type $\alpha$-SiC layer 13 is wide in comparison with that of the p-type $\beta$-SiC layer 12, so that light produced in the p-type β-SiC layer 12 can be emitted outside of the diode without reabsorption by the p-type α-SiC layer 13.

Thus, the light-emitting diode 1 can attain a high luminous efficiency as compared with light-emitting diodes which do not contain the p-type α-SiC layer 13.

EXAMPLE 2

Figure 3:
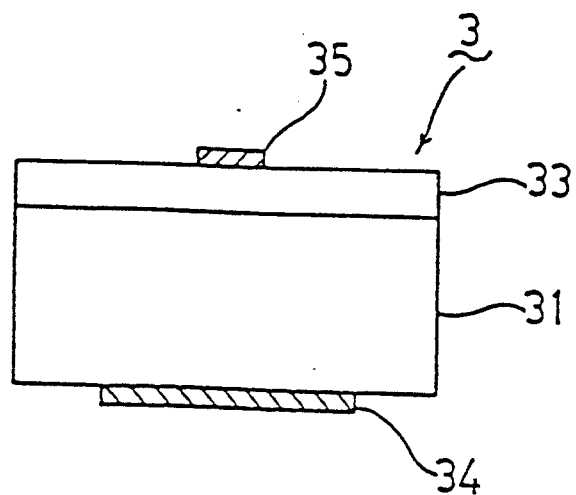
FIG. 3 is a sectional view showing another silicon carbide semiconductor device, i.e., a photodiode, for an embodiment of this invention.

FIG. 3 shows another silicon diode semiconductor device, i.e., a photodiode 3, for another embodiment of this invention, which is produced as follows: On an n-type β-SiC substrate 31 (the thickness thereof being about 30 μm) which has been produced by the CVD method, a p-type α-SiC layer 33 (the thickness thereof being about 1 μm) is grown by the CVD method. The n-type and p-type impurities are the same as in Example 1. Then, the back face of the n-type β-SiC substrate 31 and the upper face of the p-type α-SiC layer 33 are subjected to a vapor deposition treatment with nickel (Ni) and an alloy of aluminum-silicon (Al-si), respectively, resulting in an n-sided ohmic electrode 34 and a p-sided ohmic electrode 35, respectively. Finally, a leading wire is connected to each of the electrodes 34 and 35, so that the photodiode 3 will result.

Figure 4:
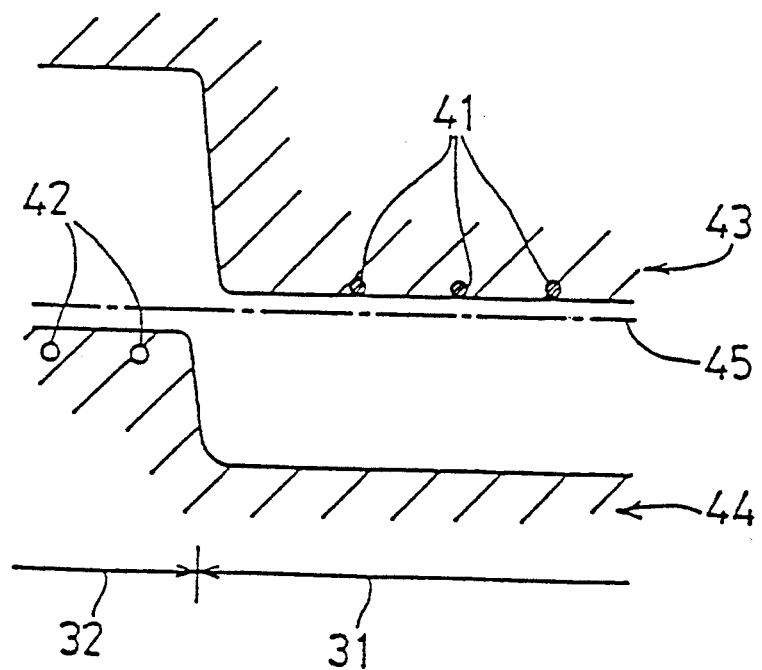
FIG. 4 is a schematic diagram showing a structure for the energy bands of the silicon carbide semiconductor device shown in FIG. 3.

The photodiode 3 obtained in this way has a heterojunction composed of the n-type β-SiC substrate 31 and the p-type α-SiC layer 33, and can operate as a broadband photodetector as described below. FIG. 4 shows a structure for the energy bands of the photodiode 3. In this figure, the conduction band, the valence band, and the Fermi level are represented by reference numerals 43, 44, and 45, respectively. A part of light incident on the p-type α-SiC layer 33 is transmitted through the p-type α-SiC layer 33 and is absorbed in the vicinity of the p-n junction so that the creation of a pair of electrons 41 and holes 42 is caused. The created carriers (i.e., the electrons 41 and the holes 42) give rise to photocurrent or photovoltage, which is detected as electric signals. When a semiconductor with the same forbidden band gap as the n-type substrate 31 (that is, β-SiC) is used as the p-type layer 33, incident light of energy larger than the forbidden band gap (i.e., light of short wavelengths) is almost completely absorbed by the p-type layer 33, so that the light cannot reach the p-n junction region, while incident light of energy smaller than the forbidden band gap (i.e., light of long wavelengths) passes through both the p-type layer 33 and the n-type substrate 31. Therefore, light having energy slightly larger than the forbidden band gaps of the p-type layer 33 and the n-type substrate 31 (e.g., light with a wavelength of about 540 nm when β-SiC is used) only contributes to the generation of electric signals.

In this example, when α-SiC having a forbidden band gap wider than the n-type substrate 31 is used for the p-type layer 33, light of energy smaller than the forbidden band gap of the p-type α-SiC 33 (i.e., 2.9 eV or less, which corresponds to the wavelength of light being about 430 nm or more) and larger than the forbidden band gap of the n-type β-SiC substrate 31 (i.e., 2.2 eV or more, which corresponds to the wavelength of light being about 560 nm or less) is absorbed by the p-n junction region, and contributes to the generation of electrical signals. Accordingly, the photodiode 3 can operate as a broad-band photodetector which has sensitivity to light with a wavelength between 430 and 560 nm.

EXAMPLE 3

Figure 5:
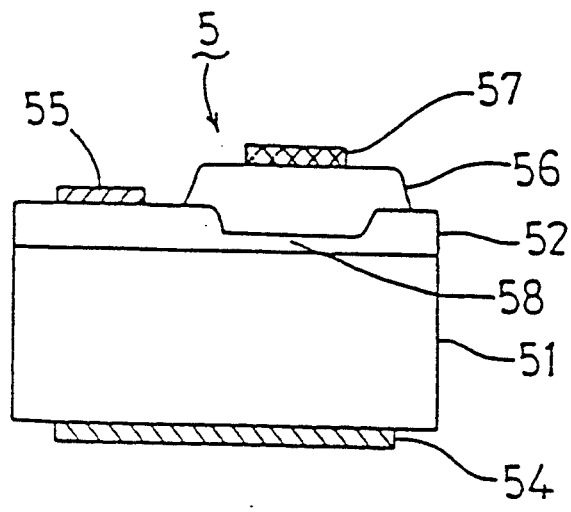
FIG. 5 is a sectional view showing another silicon carbide semiconductor device, i.e., a bipolar transistor, for an embodiment of this invention.

FIG. 5 shows another silicon carbide semiconductor device, i.e., a bipolar transistor 5, for another embodiment of this invention, which is produced as follows: On an n-type β-SiC substrate 51 (the thickness thereof being about 30 μm) which has been produced by the CVD method, a p-type β-SiC layer 52 (the thickness thereof being about 1 μm) is grown by the CVD method. A portion 58, which corresponds to the base region of the bipolar transistor, of the p-type β-SiC layer 52 is removed by an etching technique with an appropriate mask, so that a thickness of about 0.5 μm remains. Then, on the p-type β-SiC layer 52, an n-type αSiC layer 56 is grown to a thickness of about 1 μm. A portion, which is the portion other than the portion corresponding to the base region, of the n-type α-SiC layer 56 is removed by an etching technique with an appropriate mask. On the back face of the n-type β-SiC substrate 51 and the upper face of the n-type α-SiC layer 56 are subjected to a vapor deposition treatment with nickel (Ni), resulting in ohmic electrodes 54 and 57, respectively. The upper face of the p-type β-SiC layer 52 is subjected to a vapor deposition treatment with an alloy of aluminum-silicon (Al-Si), resulting in an ohmic electrode 55. In this way, the npn-type bipolar transistor 5 is completed in which the electrode 57 functions as an emitter electrode, the electrode 55 functions as a base electrode, and the electrode 54 functions as a collector electrode.

Figure 6:
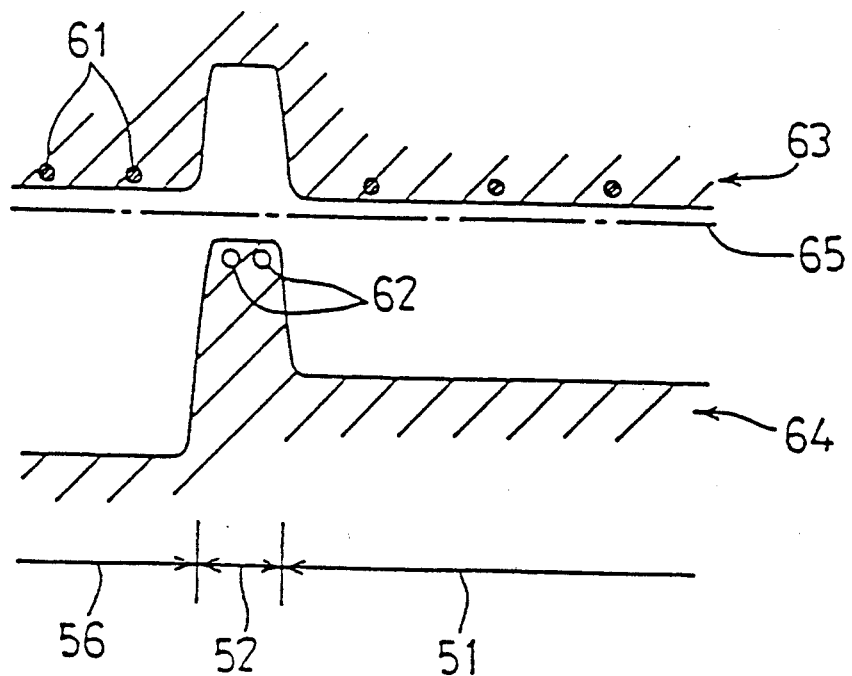
FIG. 6 is a schematic diagram showing a structure for the energy bands of the silicon carbide semiconductor device shown in FIG. 5.

In the bipolar transistor 5, the n-type α-SiC layer 56 functioning as an emitter and the p-type β-SiC layer 52 functioning as a base constitute a heterojunction. FIG. 6 shows a structure of the energy bands of the bipolar transistor 5. In this figure, the conduction band, the valence band, and the Fermi level are represented by reference numerals 63, 64, and 56, respectively. As seen from FIG. 6, at the heterojunction region between the emitter (i.e., the n-type α-SiC layer 56) and the base (i.e., the p-type β-SiC layer 52), there becomes a high barrier for holes due to the difference in forbidden band gap between the β-SiC layer and the α-SiC layer. Therefore, when a forward bias voltage is applied between the emitter and the base, an injection of electrons 61 from the emitter to the mase mainly occurs while the injection of holes 62 from the base to the emitter is negligible because of the high barrier. As a result, the efficiency of injection into the emitter can be increased, is that the degree for amplification of the bipolar transistor 5 is increased.

The excellent characteristics of the silicon carbide semiconductor devices in the above-mentioned embodiments can be attained by forming their heterojunctions from polytypes of silicon carbide. If the heterojunction is formed from silicon carbide and a semiconductor material other than silicon carbide, it will be difficult to obtain excellent characteristics because of the occurrence of crystal defects, etc., as mentioned above.

Although the above-mentioned examples only disclose the chemical vapor deposition (CVD) technique for growing single crystals of silicon carbide, other techniques such as liquid phase epitaxy and the like can also be employed. In fabricating the silicon carbide semiconductor device of this invention, any process, such as impurity diffusion, ion implantation, or other processes which is usually used for the production of semiconductor devices using silicon or gallium arsenide, can be used. Moreover, the electrode materials are not limited to the materials mentioned above, and various kinds of materials, which are usually used for electrodes, can be used.

Although the above-mentioned examples only disclose the light emitting diode, the photodiode, and the bipolar transistor, the embodiments of this invention are, of course, applicable to a variety of silicon carbide semiconductor devices having at least one heterojunction such as diodes, transistors, light-emitting diodes, laser diodes, and charge coupled devices; a variety of integrated circuits, such as IC, LSI and VLSI, composed of these silicon carbide semiconductor devices; and other silicon carbide semiconductor devices having at least one heterojunction for the novel functions which conventional semiconductor devices cannot accomplish.

Moreover, this invention is applicable not only to silicon carbide semiconductor devices, but to a wide variety of semiconductor devices employing other semiconductor materials (e.g., ZnS) which has polytypes with the same lattice constants and different forbidden band gaps.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A silicon carbide semiconductor device comprising at least one $\alpha/\beta$ heterojunction, wherein the device comprises a light-emitting diode including:
   an n-type conductivity $\beta$-type silicon carbide semiconductor substrate,
   a first p-type conductivity $\beta$-type silicon carbide semiconductor layer grown on said n-type conductivity $\beta$-type silicon carbide semiconductor substrate,
   a second p-type conductivity $\alpha$-type silicon carbide semiconductor layer grown on said p-type conductivity B-type silicon carbide semiconductor layer formed on said n-type conductivity $\beta$-type silicon carbide semiconductor substrate,
   an n-sided ohmic electrode disposed on a back face of said n-type conductivity $\beta$-type silicon carbide semiconductor substrate opposite to the face of said n-type conductivity $\beta$-type silicon carbide semiconductor substrate having said first p-type conductivity $\beta$-type silicon carbide semiconductor layer grown thereon, and
   a p-sided ohmic electrode disposed on the upper face of said second p-type conductivity $\alpha$-type silicon carbide semiconductor layer.

2. A silicon carbide semiconductor device comprising at least one $\alpha/\beta$ heterojunction, wherein the device comprises a bipolar transistor including:
   an n-type conductivity $\beta$-type silicon carbide collector layer,
   a p-type conductivity $\beta$-type silicon carbide base layer grown on said n-type conductivity $\beta$-type silicon carbide collector layer,
   an n-type conductivity $\alpha$-type silicon carbide emitter layer grown on said p-type conductivity $\beta$-type silicon carbide base layer,
   a collector electrode disposed on a back face of said n-type conductivity $\beta$-type silicon carbide collector layer opposite to the face of said n-type conductivity $\beta$-type silicon carbide collector layer having said p-type conductivity $\beta$-type silicon carbide base layer grown thereon, and
   an emitter electrode disposed on the upper face of said n-type conductivity $\alpha$-type silicon carbide emitter layer.

* * * * *